(12) United States Patent
Lee et al.

(10) Patent No.: US 11,342,350 B2
(45) Date of Patent: May 24, 2022

(54) SEMICONDUCTOR MEMORY DEVICE WITH IMPROVED OPERATION SPEED

(71) Applicant: SK hynix Inc., Icheon-si (KR)

(72) Inventors: Sang Heon Lee, Chungcheongbuk-do (KR); Hyun Heo, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 63 days.

(21) Appl. No.: 16/700,857

(22) Filed: Dec. 2, 2019

(65) Prior Publication Data
US 2020/0373319 A1    Nov. 26, 2020

(30) Foreign Application Priority Data

May 20, 2019   (KR) .................. 10-2019-0059056

(51) Int. Cl.
| | |
|---|---|
| *G11C 5/06* | (2006.01) |
| *H01L 27/11573* | (2017.01) |
| *H01L 27/11582* | (2017.01) |
| *H01L 27/1157* | (2017.01) |
| *H01L 27/11565* | (2017.01) |

(52) U.S. Cl.
CPC ........ *H01L 27/11573* (2013.01); *G11C 5/063* (2013.01); *H01L 27/1157* (2013.01); *H01L 27/11565* (2013.01); *H01L 27/11582* (2013.01)

(58) Field of Classification Search
CPC ..... G11C 16/0483; G11C 16/24; G11C 5/063; H01L 27/11573
See application file for complete search history.

(56) References Cited

U.S. PATENT DOCUMENTS

| | | | |
|---|---|---|---|
| 2009/0294833 A1* | 12/2009 | Kim | ............... H01L 29/792 257/324 |
| 2017/0358593 A1 | 12/2017 | Yu et al. | |

FOREIGN PATENT DOCUMENTS

KR    1020170005660 A    1/2017

* cited by examiner

*Primary Examiner* — Ismail A Muse
*Assistant Examiner* — Gustavo G Ramallo
(74) *Attorney, Agent, or Firm* — William Park & Associates Ltd.

(57) ABSTRACT

A semiconductor memory device is provided. The semiconductor memory device includes a memory cell array disposed on a substrate, a bit line connected to the memory cell array, a peripheral circuit disposed between the memory cell array and the substrate, the peripheral circuit including a transistor, a conductive line disposed between the memory cell array and the transistor, a lower connection structure connecting the conductive line and the transistor, and two or more upper connection structures connecting the bit line and the conductive line, the two or more upper connection structures being spaced apart from each other.

16 Claims, 15 Drawing Sheets

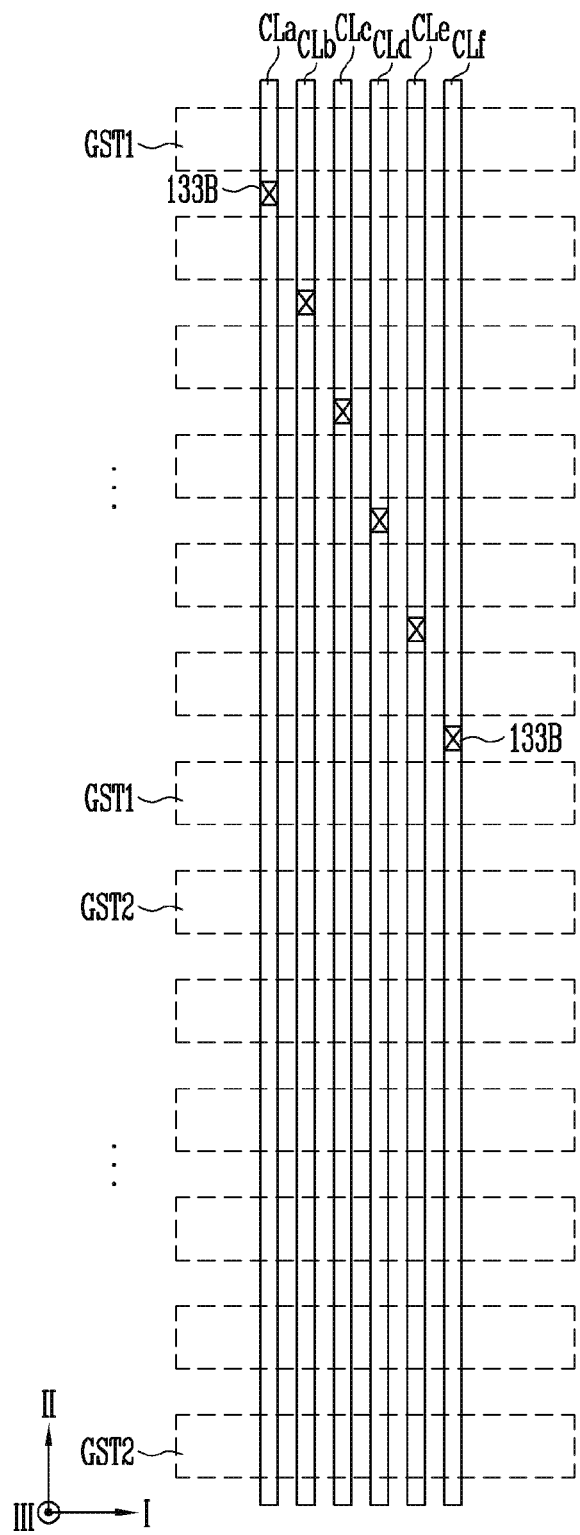

SEMICONDUCTOR MEMORY DEVICE WITH IMPROVED OPERATION SPEED

CROSS-REFERENCE TO RELATED APPLICATION

The present application claims priority under 35 U.S.C. § 119(a) to Korean patent application number 10-2019-0059056, filed on May 20, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

A semiconductor memory device includes memory cells capable of storing data. In order to improve the degree of integration of memory cells, a three-dimensional semiconductor memory device has been proposed.

Various three-dimensional semiconductor memory devices have been developed to improve the degree of integration and stability thereof. The operational reliability of a three-dimensional semiconductor memory device may be reduced by various causes.

SUMMARY

In accordance with an embodiment of the present disclosure, there may be provided a semiconductor memory device including: a memory cell array disposed on a substrate, a bit line connected to the memory cell array, a peripheral circuit disposed between the memory cell array and the substrate, the peripheral circuit including a transistor, a conductive line disposed between the memory cell array and the transistor, a lower connection structure connecting the conductive line and the transistor, and two or more upper connection structures connecting the bit line and the conductive line, the two or more upper connection structures being spaced apart from each other.

In accordance with an embodiment of the present disclosure, there may be provided a semiconductor memory device including: a bit line disposed on a substrate including a transistor, a conductive line disposed between the substrate and the bit line, a lower connection structure connected between the transistor and the conductive line, first and second upper connection structures extending toward the bit line from the conductive line to be in contact with the conductive line and the bit line, and a first cell string disposed between the first upper connection structure and the second upper connection structure, the first cell string being connected to the bit line.

In accordance with an embodiment of the present disclosure, there may be provided a semiconductor memory device including: a substrate including transistors, bit lines arranged on the substrate to be spaced apart from each other in a first direction, a memory cell array disposed between the bit lines and the substrate, conductive lines disposed between the memory cell array and the substrate, the conductive lines extending in parallel to the bit lines, lower connection structures respectively connecting the transistors to the conductive lines, first upper connection structures respectively connecting the conductive lines to the bit lines, and second upper connection structures respectively connecting the conductive lines to the bit lines. The memory cell array may include first gate stack structures that are disposed between the bit lines and the substrate and are alternately disposed with the transistors in a second direction intersecting the first direction and second gate stack structures that are spaced apart from the first gate stack structures in the second direction and are arranged in the second direction. The first upper connection structures may be disposed between the first gate stack structures, and the second upper connection structures may be disposed between the second gate stack structures.

BRIEF DESCRIPTION OF THE DRAWINGS

FIGS. 7A to 7E are plan views illustrating structures connecting transistors of the page buffer circuit shown in FIG. 2 to bit lines in accordance with an embodiment of the present disclosure.

DETAILED DESCRIPTION

Figure 1:
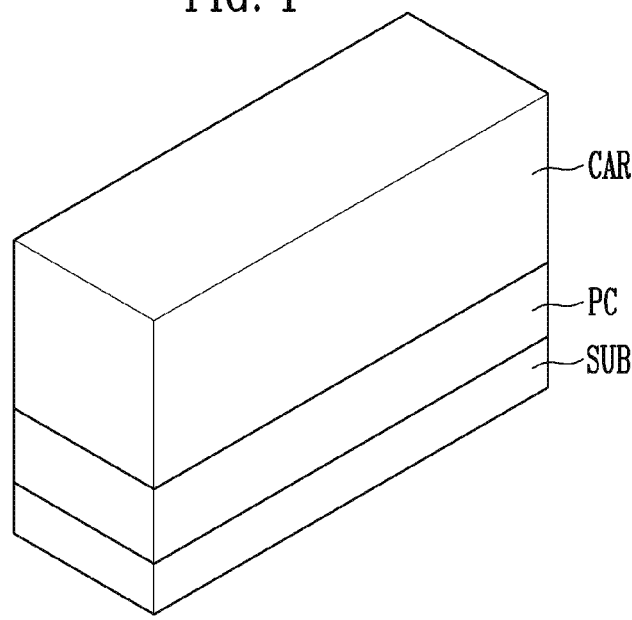
FIG. 1 is a block diagram schematically illustrating a semiconductor memory device in accordance with an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Examples of embodiments will be described with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments provide a semiconductor memory device capable of improving the operational reliability thereof.

FIG. 1 is a block diagram schematically illustrating a semiconductor memory device in accordance with an embodiment of the present disclosure.

Referring to FIG. 1, the semiconductor memory device may include a peripheral circuit PC and a memory cell array CAR, which are disposed on a substrate SUB.

The substrate SUB may be a single crystalline semiconductor layer. For example, the substrate SUB may be a silicon on insulator substrate, a germanium substrate, a germanium on insulator substrate, a silicon-germanium substrate, or an epitaxial film formed through a selective epitaxial growth process.

The memory cell array CAR may include a plurality of memory blocks. Each of the memory blocks may include a plurality of cell strings. Each of the cell strings may be electrically connected to a gate stack structure, a bit line, and a source line. The gate stack structure may include word lines and select lines. Each of the select lines is used as a gate electrode of a select transistor corresponding thereto, and each of the word lines is used as a gate electrode of a memory cell corresponding thereto.

The peripheral circuit PC may include NMOS and PMOS transistors, a resistor, and a capacitor, which are electrically connected to the memory cell array CAR. The NMOS and PMOS transistors, the resistor, and the capacitor may be used as elements that constitute a row decoder, a column decoder, a page buffer circuit, and a control logic. The peripheral circuit PC may be disposed between the memory cell array CAR and the substrate SUB. For example, the memory cell array CAR may overlap with the peripheral circuit PC. When the memory cell array CAR overlaps with the peripheral circuit PC, the area of the substrate SUB occupied by the memory cell array CAR and the peripheral circuit PC can be reduced.

Figure 2:
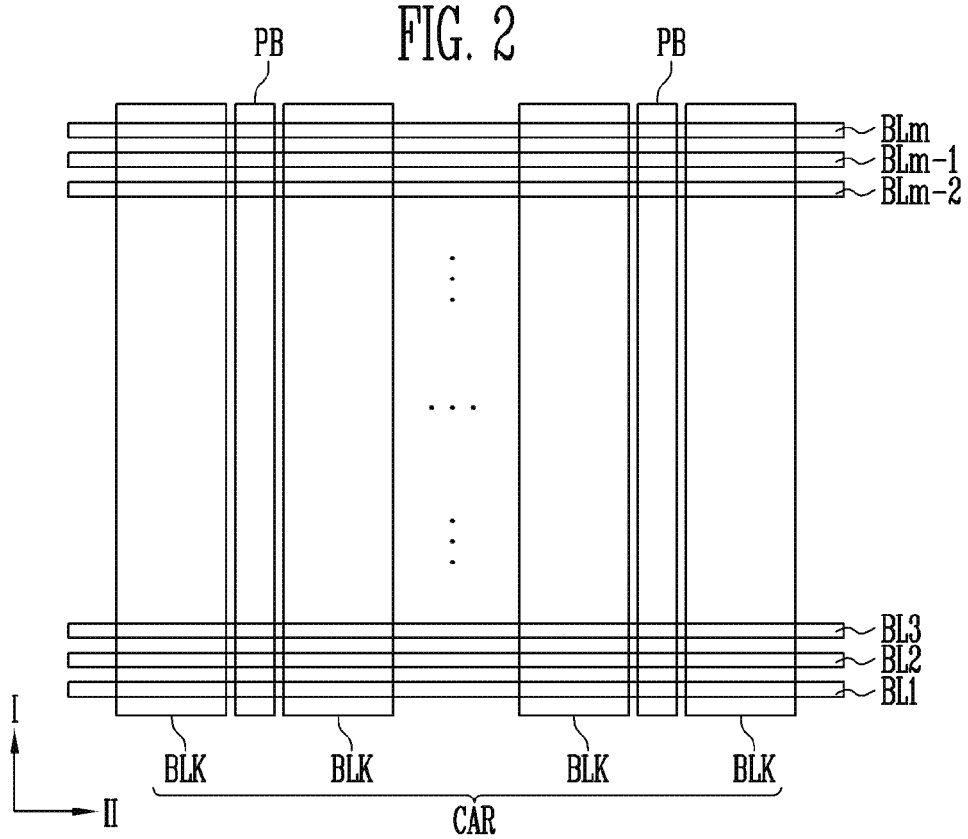
FIG. 2 is a plan view illustrating a schematic layout of a memory cell array and a page buffer circuit in accordance with an embodiment of the present disclosure.

FIG. 2 is a plan view illustrating a schematic layout of a memory cell array and a page buffer circuit in accordance with an embodiment of the present disclosure.

Referring to FIG. 2, the memory cell array CAR may include a plurality of memory blocks BLK. The memory blocks BLK may be spaced apart from each other.

The page buffer circuit PB may be exposed through spaces between adjacent memory blocks BLK. The page buffer circuit PB may be included in the peripheral circuit PC shown in FIG. 1. The page buffer circuit PB may be connected to the memory blocks BLK through bit lines BL1 to BLm (m is a natural number). The page buffer circuit PB may read data from the memory cell array CAR through the bit lines BL1 to BLm, or program the memory cell array CAR through the bit lines BL1 to BLm.

The bit lines BL1 to BLm are arranged to be spaced apart from each other. For example, the bit lines BL1 to BLm may be arranged to be spaced apart from each other in a first direction I, and the memory blocks BLK may be arranged to be spaced apart from each other in a second direction II intersecting the first direction I. For example, the first direction I and the second direction II may perpendicularly intersect each other.

Each of the bit lines BL1 to BLm may extend to overlap with the memory blocks BLK and the page buffer circuit PB. For example, each of the bit lines BL1 to BLm may extend in the second direction II.

Figure 3:
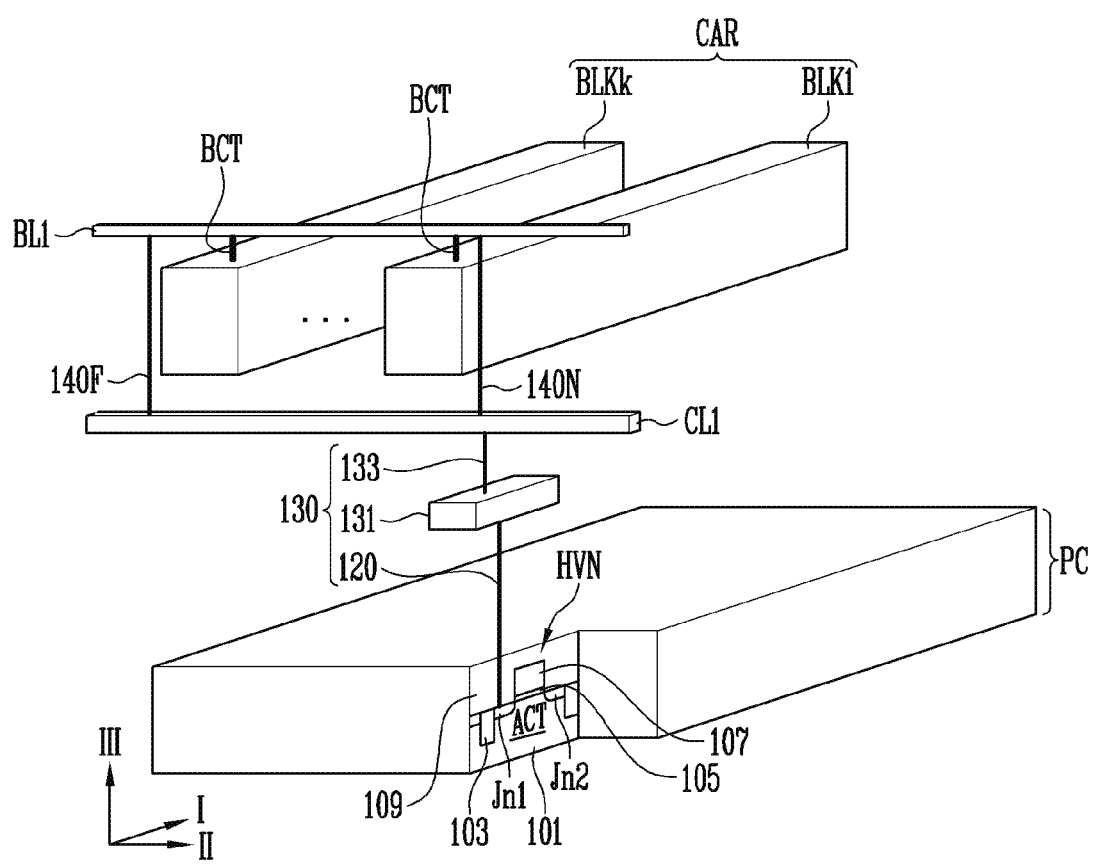
FIGS. 3 and 4 are views illustrating structures connecting a transistor included in the page buffer circuit shown in FIG. 2 to the memory cell array in accordance with an embodiment of the present disclosure.
Figure 4:
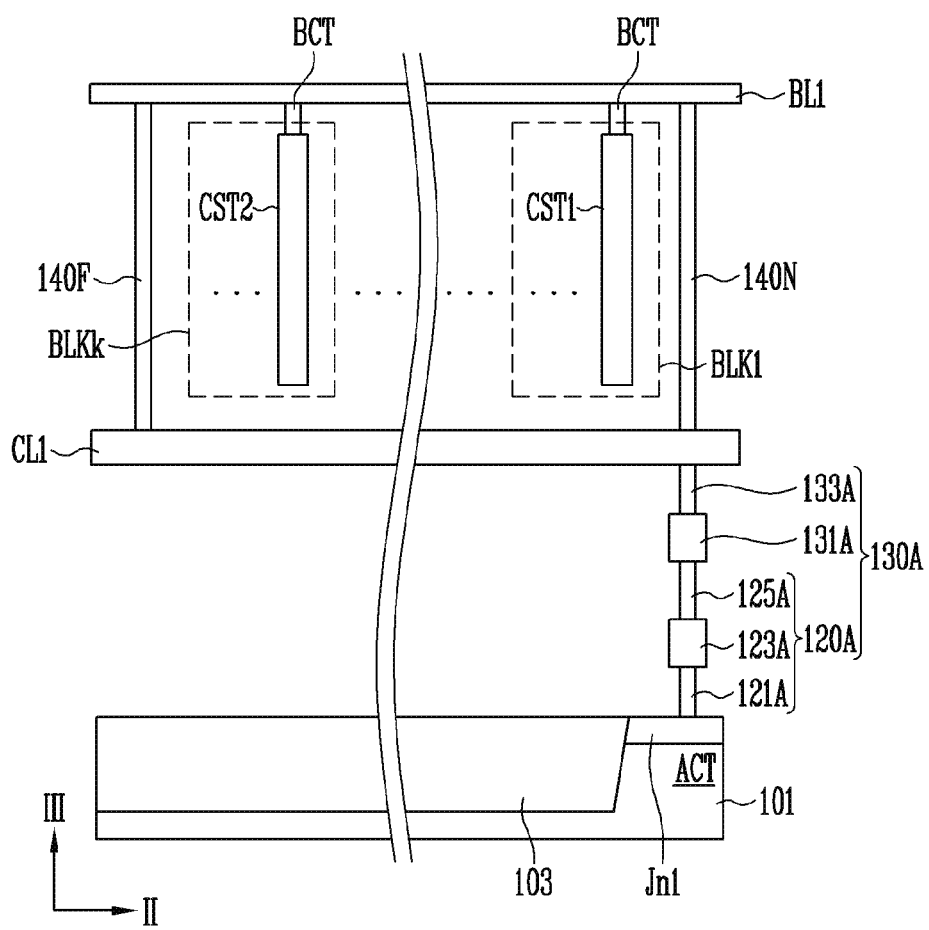

FIGS. 3 and 4 are views illustrating structures connecting a transistor included in the page buffer circuit PB shown in FIG. 2 to the memory cell array CAR in accordance with an embodiment of the present disclosure.

FIG. 3 is a schematic perspective view illustrating structures connecting a transistor HVN to the memory cell array CAR.

Referring to FIG. 3, the peripheral circuit PC may include the transistor HVN, and the memory cell array CAR may include memory blocks BLK1 to BLKk (k is a natural number) arranged along the extending direction of the bit line BL1.

The transistor HVN may be connected to the memory cell array CAR via the bit line BL1 corresponding thereto. The memory blocks BLK1 to BLKk included in the memory cell array CAR may be arranged adjacent to each other in the second direction II as the extending direction of the bit line BL1.

The bit line BL1 may be connected to the memory blocks BLK1 to BLKk in various manners. In an embodiment, the bit line BL1 may be connected to the memory blocks BLK1 to BLKk through bit line contact plugs BCT connected to the memory blocks BLK1 to BLKk.

The transistor HVN may be included in the page buffer circuit PB shown in FIG. 2. That is, the transistor HVN may be used to read data from the memory cell array CAR or to program the memory cell array CAR. The page buffer circuit PB shown in FIG. 2 may further include a plurality of transistors in addition to the transistor HVN shown in FIG. 3. For example, transistors respectively corresponding to the bit lines BL1 to BLm shown in FIG. 2 may be included in the page buffer circuit PB.

The transistor HVN may include junctions Jn1 and Jn2 defined in an active region ACT of a substrate 101 and a gate electrode 107 formed on the active region ACT of the substrate 101. The active region ACT of the substrate 101 may be defined between isolation layers 103 formed in the substrate 101. The isolation layers 103 are patterns defining the active region ACT of the substrate 101, and may be formed of an insulating material. The gate electrode 107 may be formed on the active region ACT of the substrate 101 with a gate insulating layer 105 interposed therebetween. The junctions Jn1 and Jn2 are regions defined by injecting a conductivity type impurity into the active region ACT of the substrate 101, and may be disposed at both sides of the gate electrode 107. For example, each of the junctions Jn1 and Jn2 may include an n-type impurity. Each of the junctions Jn1 and Jn2 is used as a source junction or drain junction.

The transistor HVN may be covered with a lower insulating structure 109 disposed on the substrate 101. The lower insulating structure 109 may be formed in a structure in which two or more insulating layers are stacked.

The transistor HVN may be connected to the bit line BL1 corresponding thereto via a lower connection structure 130, a conductive line CL1, and two or more upper connection structures 140N and 140F.

The lower connection structure 130 may be connected between the transistor HVN corresponding thereto and the conductive line CL1 corresponding thereto. The lower connection structure 130 may include conductive connection patterns 120, 131, and 133. The connection patterns 120, 131, and 133 may be stacked in a third direction III. The third direction III is a direction intersecting a plane extending along the first direction I and the second direction II. For example, the third direction III may perpendicularly intersect the plane.

The conductive line CL1 may be disposed between the transistor HVN corresponding thereto and the memory cell array CAR. In other words, the conductive line CL1 may be disposed between the bit line BL1 corresponding thereto and the lower connection structure 130 corresponding thereto. The conductive line CL1 may have a resistance lower than that of the bit line BL1. In an embodiment, the conductive line CL1 may include a conductive material having a resistance lower than that of the bit line BL1. In an embodiment, a thickness of the conductive line CL1 in the third direction III may be formed thicker than that of the bit line BL1. The conductive line CL1 may extend in parallel to the bit line BL1 to connect two or more contact nodes facing the bit line BL1 corresponding thereto.

The upper connection structures 140N and 140F may extend toward the bit line BL1 corresponding thereto from contact nodes of the conductive line CL1 corresponding thereto. That is, the upper connection structures 140N and 140F may be disposed between the bit line BL1 and the conductive line CL1, and connect the bit line BL1 to the conductive line CL1. Each of the upper connection structures 140N and 140F may include one or more conductive patterns. In an embodiment, each of the upper connection structures 140N and 140F may include a single conductive contact plug extending from the conductive line CL1 to be in contact with the bit line BL1. In an embodiment, each of the upper connection structures 140N and 140F may include two or more conductive connection patterns stacked between the conductive line CL1 and the bit line BL1.

The upper connection structures 140N and 140F may be disposed to be spaced apart from each other in the extending direction of the bit line BL1. For example, the upper connection structures 140N and 140F may be disposed to be spaced apart from each other in the second direction II. At least one of the memory blocks BLK1 to BLKk disposed between the bit line BL1 and the conductive line CL1 may be disposed between adjacent upper connection structures in the extending direction of the bit line BL1. For example, the upper connection structures 140N and 140F may include a first upper connection structure 140N and a second upper connection structure 140F. The memory blocks BLK1 to BLKk may be disposed between the first upper connection structure 140N and the second upper connection structure 140F.

The first upper connection structure 140N may overlap with the lower connection structure 130, or be disposed close to the transistor HVN. The second upper connection structure 140F does not overlap with the lower connection structure 130, and may be further spaced apart from the transistor HVN than the first upper connection structure 140N.

The memory blocks BLK1 to BLKk disposed between the peripheral circuit PC and the bit line BL1 may be spaced apart from any one transistor HVN included in the page buffer circuit PB at different distances. For example, the memory blocks BLK1 to BLKk may include a first memory block BLK1 adjacent to the transistor HVN and a [k]-memory block BLKk further spaced apart from the transistor HVN than the first memory block BLK1. In accordance with an embodiment of the present disclosure, the transistor HVN can be connected to the [k]-memory block BLKk through the conductive line CL1, the second upper connection structure 140F, and the bit line BL1. A loading effect of the bit line BL1 can be compensated through the conductive line CL1.

FIG. 4 is a schematic sectional view illustrating structures connecting cell strings included in the memory cell array CAR shown in FIG. 3 to the transistor HVN.

Referring to FIG. 4, the junction Jn1 may be in contact with a lower connection structure 130A. The junction Jn1 is one of the junctions Jn1 and Jn2 of the transistor HVN described with reference to FIG. 3, and may be defined in the active region ACT of the substrate 101, which is defined by the isolation layers 103.

The lower connection structure 130A may include a first connection pattern 120A connected to the junction Jn1 of the transistor. The first connection pattern 120A may include a first conductive contact plug 121A, a first metal pattern 123A, and a second conductive contact plug 125A, which are stacked between the junction Jn1 and the conductive line CL1. The first conductive contact plug 121A may be in contact with the junction Jn1, and extend toward the conductive line CL1. The first metal pattern 123A may be disposed on the first conductive contact plug 121A. The first metal pattern 123A may be formed to have an area wider than that of the first conductive contact plug 121A on a horizontal plane, to increase a contact margin. The second conductive contact plug 125A may extend toward the conductive line CL1 from the first metal pattern 123A.

The lower connection structure 130A may further include a second connection pattern 131A disposed between the second conductive contact plug 125A and the conductive line CL1. The second connection pattern 131A is a second metal pattern, and may be disposed on the second conductive contact plug 125A. The second connection pattern 131A may be formed to have an area wider than that of the second conductive contact plug 125A on a horizontal plane, to increase a contact margin.

The lower connection structure 130A may further include a third connection pattern 133A disposed between the second connection pattern 131A and the conductive line CL1. The third connection pattern 133A is a third conductive contact plug, and may be disposed on the second connection pattern 131A. The third connection pattern 133A may extend to be in contact with the conductive line CL1 from the second connection pattern 131A.

Cell strings CST1 and CST2 may be disposed between the conductive line CL1 and the bit line BL1, which are connected to each other by the first and second upper connection structures 140N and 140F. The cell strings CST1 and CST2 may be respectively included in the memory blocks BLK1 and BLKk. For example, the cell strings CST1 and CST2 may include a first cell string CST1 included in the first memory block BLK1 and a second cell string CST2 included in the [k]-memory block BLKk. The first cell string CST1 and the second cell string CST2 may be disposed between the first upper connection structure 140N and the second upper connection structure 140F.

The first cell string CST1 and the second cell string CST2 may be connected to the bit line BL1 via the bit line contact plug BCT. The first cell string CST1 and the second cell string CST2 may be spaced apart from the junction Jn1 of the transistor at different distances. For example, the second cell string CST2 may be further spaced apart from the junction Jn1 of the transistor than the first cell string CST1. The first cell string CST1 and the second cell string CST2 may be formed in various structures.

FIGS. 5A to 5E are perspective views illustrating various embodiments of cell strings. For convenience of description, interlayer insulating layers are not shown in FIGS. 5A to 5E. A first direction I, a second direction II, and a third direction III, which are shown in FIGS. 5A to 5E, are the same as defined with reference to FIGS. 2 to 4.

Referring to FIGS. 5A to 5E, each of the cell strings CST may include a gate stack structure GST disposed under bit lines BL and a channel structure CH penetrating the gate stack structure GST. One end of the channel structure CH may be connected to a bit line corresponding thereto via a bit line contact plug BCT. The gate stack structure GST penetrated by the channel structure CH may be disposed between the bit lines BL and the conductive line CL1 described with reference to FIGS. 3 and 4. The bit line BL1 shown in FIGS. 3 and 4 may correspond to any one of the bit lines BL shown in FIGS. 5A to 5E.

The gate stack structure GST may include electrode patterns CP1 to CPn (n is a natural number) stacked to be spaced apart from each other along the extending direction of the channel structure CH. For example, the electrode patterns CP1 to CPn may be respectively disposed in a first layer to an nth layer, which are sequentially arranged in the third direction III and are spaced apart from each other. The first layer is defined as a layer disposed most distant from the bit lines BL, and the nth layer is defined as a layer disposed closest to the bit lines BL. Each of the electrode patterns CP1 to CPn may have line shape extending in a direction intersecting the bit lines BL.

Referring to FIGS. 5A to 5D, nth patterns CPn at least disposed in the nth layer among the electrode patterns CP1 to CPn may be used as drain select lines DSL. However, the present disclosure is not limited thereto. For example, nth patterns CPn disposed in the nth layer may be used as drain select lines DSL, and besides, (n−1)th patterns CPn−1 disposed in the (n−1)th layer may be used as other drain select lines DSL.

A first pattern CP1 at least disposed in the first layer among the electrode patterns CP1 to CPn may be used as source select lines SSL. However, the present disclosure is not limited thereto. For example, the first pattern CP1 disposed in the first layer and a second pattern CP2 disposed in the second layer may be used as source select lines SSL.

Electrode patterns (e.g., CP3 to CPn−2) disposed between the drain select lines DSL and the source select lines SSL may be used as word lines WL.

The drain select lines DSL disposed in the same layer may be separated from each other by an upper slit USI overlapping with the word lines WL.

Figure 5A:
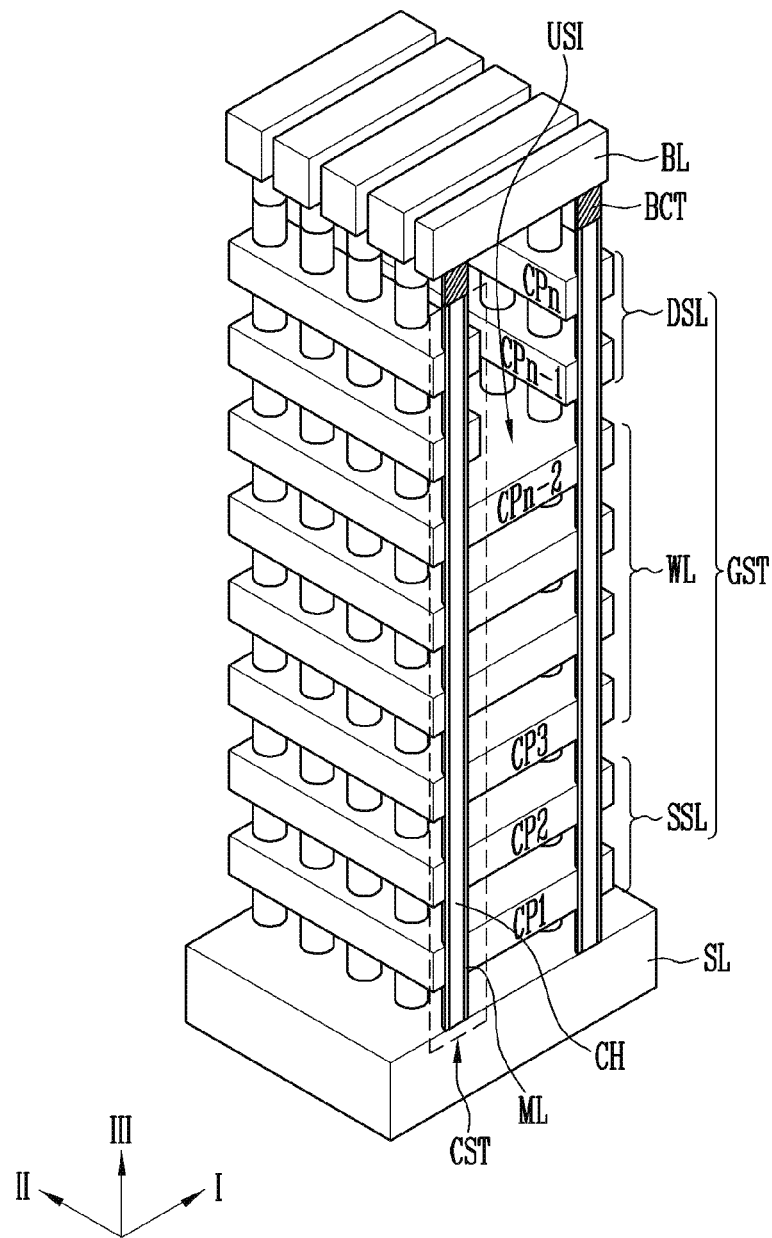
FIGS. 5A to 5E are perspective views illustrating various embodiments of cell strings.
Figure 5B:
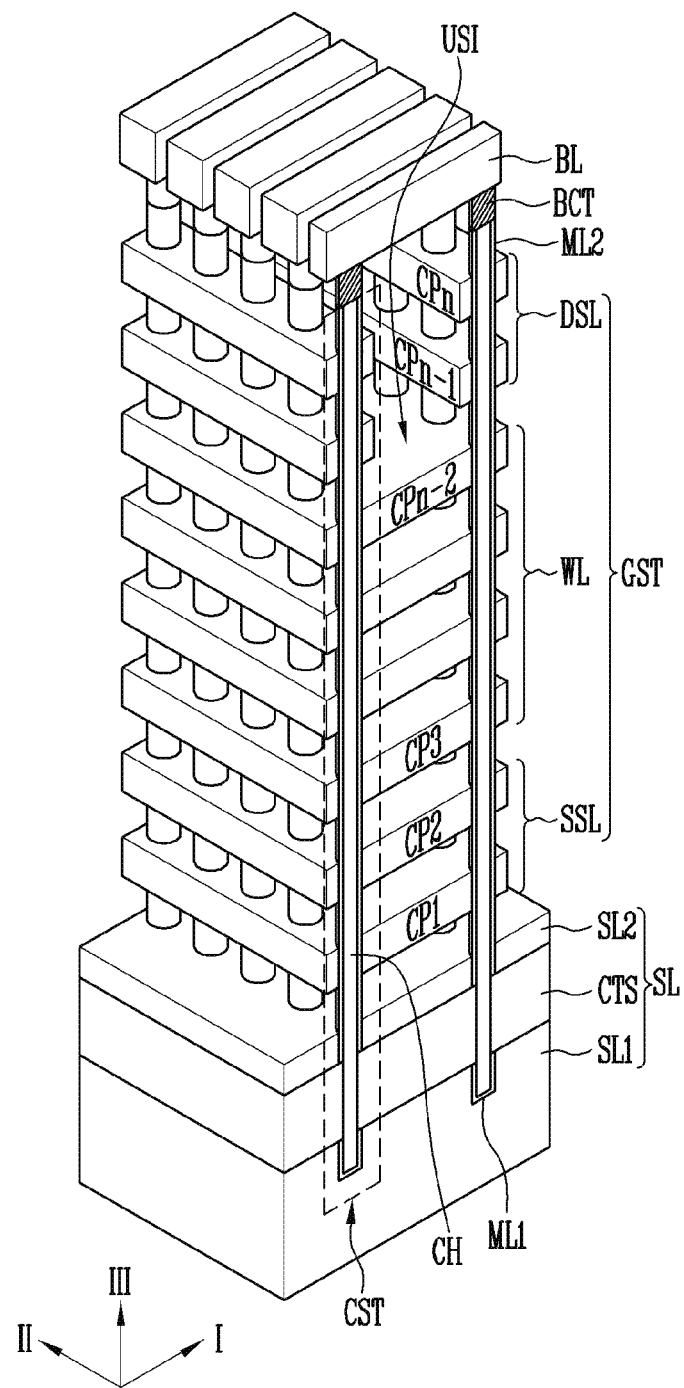
Figure 5C:
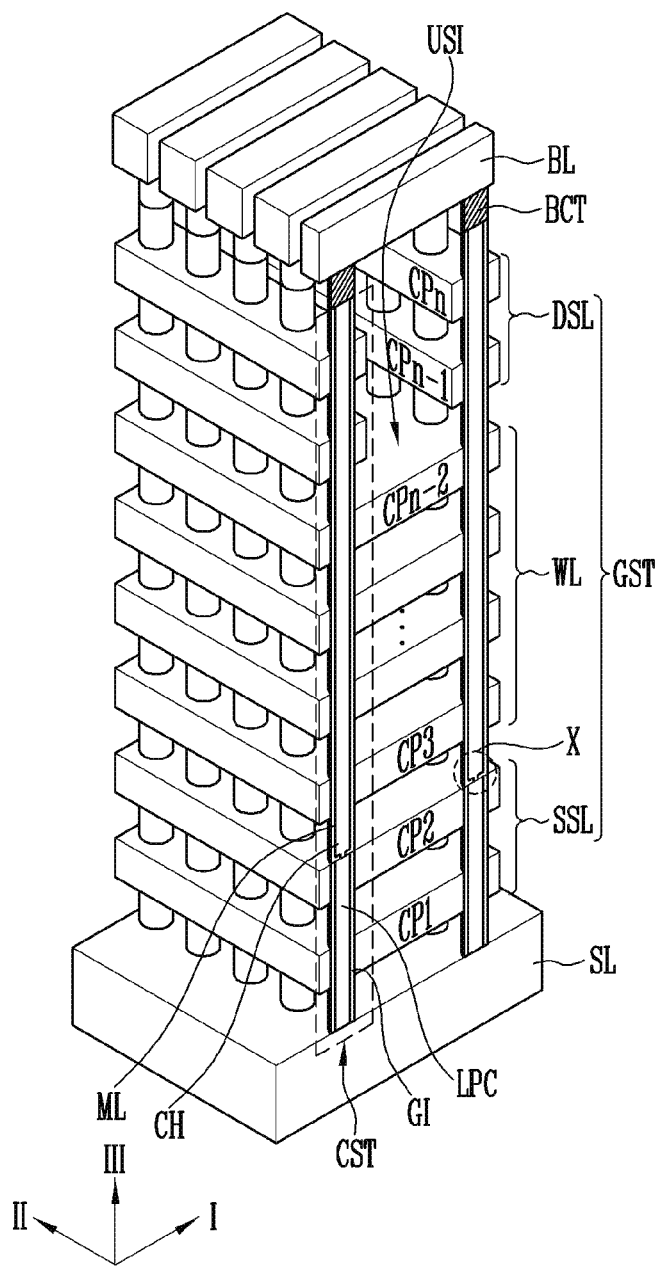
Figure 5D:
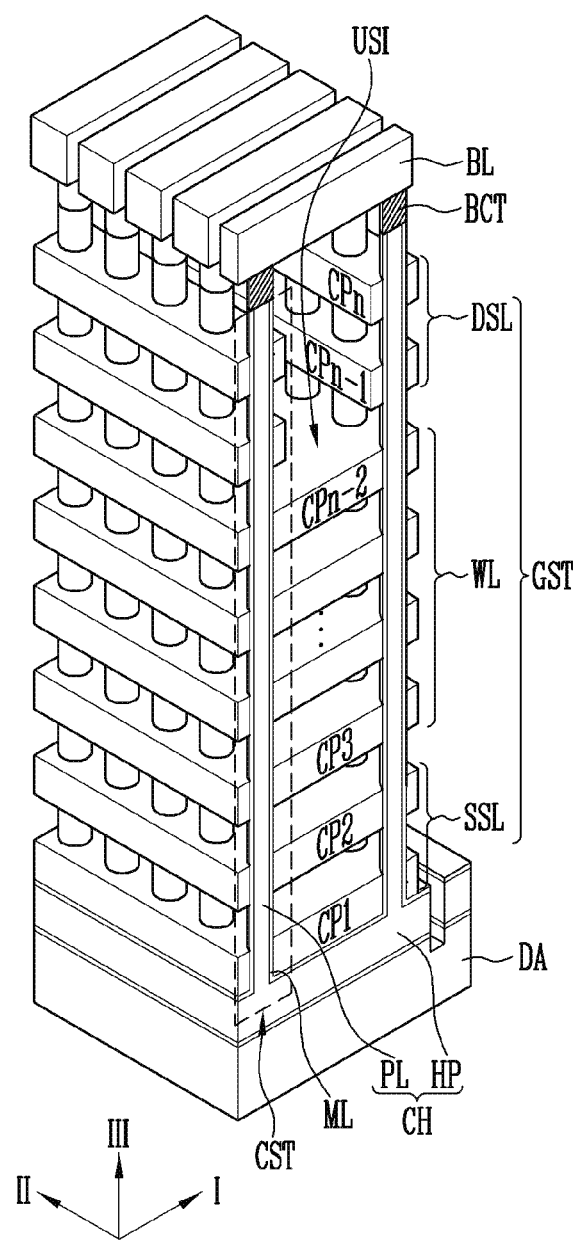
Figure 5E:
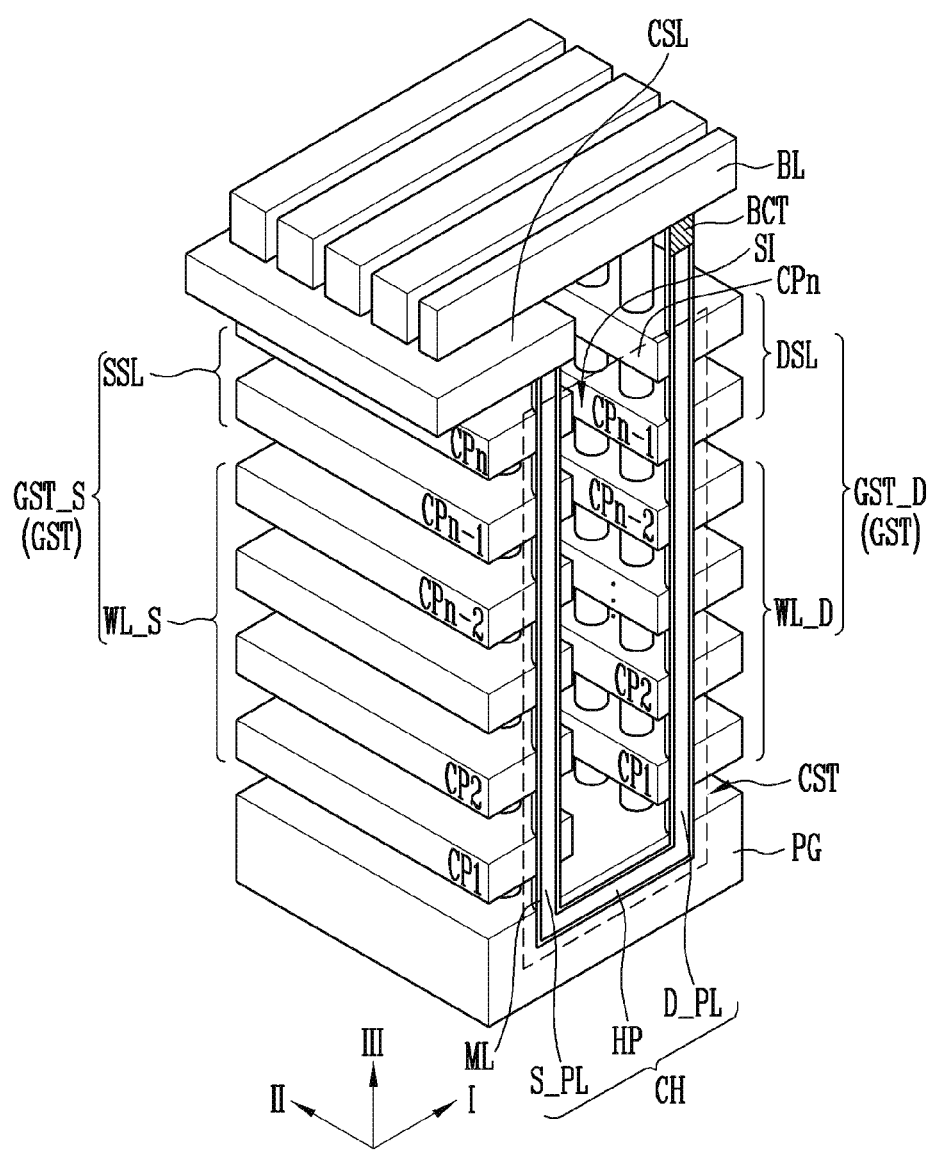

In another example, referring to FIG. 5E, the electrode patterns CP1 to CPn may be separated into a source-side stack structure GST_S and a drain-side stack structure GST_D by a slit SI.

The nth patterns CPn at least disposed in the nth layer among the electrode patterns CP1 to CPn may be used as drain and source select lines DSL and SSL. However, the present disclosure is not limited thereto. For example, nth patterns CPn disposed in the nth layer may be used as drain and source select lines DSL and SSL, and besides, the (n−1)th patterns CPn−1 disposed in the (n−1)th layer may be used as other drain and source select lines DSL and SSL. The source select lines are included in the source-side stack structure GST_S, and the drain select lines DSL are included in the drain-side stack structure GST_D.

Electrode patterns (e.g., CP1 to CPn−2) that are included in the drain-side stack structure GST_D and are disposed under the drain select lines DSL may be used as drain-side word lines WL_D. Electrode patterns (e.g., CP1 to CPn−2) that are included in the source-side stack structure GST_S and are disposed under the source select lines SSL may be used as source-side word lines WL_S.

Referring back to FIGS. 5A to 5E, the source select lines SSL may be used as gates of source select transistors. The word lines WL, the drain-side word lines WL_D, and the source-side word lines WL_S may be used as gates of memory cells. The drain select lines DSL may be used as gates of drain select transistors.

Each of the cell strings CST may include at least one source select transistor, memory cells connected in series to the source select transistor, and at least one drain select transistor connected in series to the memory cells. The channel structure CH may be formed in various structures to connect the memory cells in series.

Referring to FIG. 5A, the channel structure CH may penetrate the drain select lines, the word lines WL, and the source select lines SSL, and be directly connected to a source layer SL disposed under the electrode patterns CP1 to CPn.

The source layer SL may be in contact with a bottom surface of the channel structure CH. The source layer SL may be formed of a doped semiconductor layer including a source dopant. The source dopant may include n-type impurity. For example, the source layer SL may include n-type doped silicon.

A sidewall of the channel structure CH may be surrounded by a memory layer ML. The memory layer ML may extend along the sidewall of the channel structure CH to open an upper surface and the bottom surface of the channel structure CH.

Referring to FIG. 5B, the channel structure CH may penetrate the drain select lines DSL, the word lines WL, and the source select lines SSL, and extend to the inside of a source layer SL disposed under the electrode patterns CP1 to CPn.

The source layer SL may include a first source layer SL1, a contact source layer CTS, and a second source layer SL2. The channel structure CH may penetrate the second source layer SL2 and the contact source layer CTS, and extend to the inside of the first source layer SL1.

The first source layer SL1 may surround a lower end of the channel structure CH. The first source layer SL1 may be formed of a doped semiconductor layer including a source dopant. The source dopant may include an n-type impurity. For example, the first source layer SL1 may include n-type doped silicon.

The contact source layer CTS may be disposed on the first source layer SL1, and be in contact with an upper surface of the first source layer SL1. The contact source layer CTS may further protrude laterally toward the channel structure CH than the first source layer SL1 and the second source layer SL2. The contact source layer CTS may be in direct contact with the sidewall of the channel structure CH. The contact source layer CTS surrounds the channel structure CH.

The second source layer SL2 may be disposed between the contract source layer CTS and the source select lines SSL. The second source layer SL2 may be omitted in some cases.

Each of the contact source layer CTS and the second source layer SL2 may be formed of a doped semiconductor layer including a source dopant. The source dopant may include an n-type impurity. For example, each of the contact source layer CTS and the second source layer SL2 may include n-type doped silicon.

A first memory layer ML1 may be disposed between the channel structure CH and the first source layer SL1. An upper sidewall of the channel structure CH, which further protrudes toward the bit line BL than the contact source layer CTS, may be surrounded by a second memory layer ML2. The first memory layer ML1 and the second memory layer ML2 may be separated from each other by the contact source layer CTS.

Referring to FIG. 5C, the channel structure CH may penetrate the drain select lines DSL and the word lines WL. The channel structure CH may be connected to a lower channel structure LPC penetrating the source select lines SSL.

Figure 6:
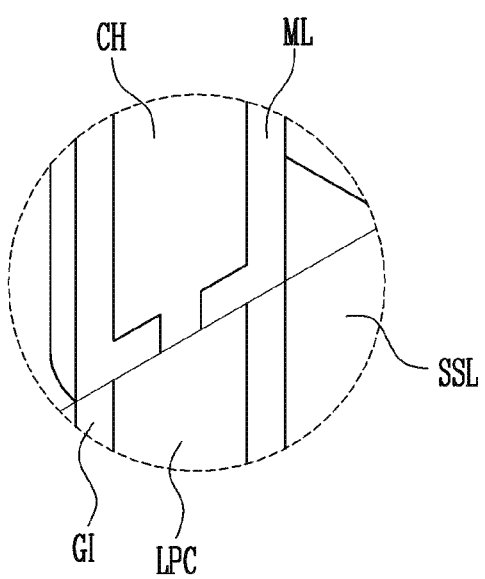
FIG. 6 is an enlarged view of region X shown in FIG. 5C.

FIG. 6 is an enlarged view of region X shown in FIG. 5C.

Referring to FIGS. 5C and 6, the lower channel structure LPC is connected to a channel structure CH corresponding thereto under the channel structure CH. The lower channel structure LPC may include a doped semiconductor layer. For example, the lower channel structure LPC may include n-type doped silicon. The channel structure CH may be surrounded by the memory layer ML. The memory layer ML may extend along the sidewall of the channel structure CH to open the upper and bottom surfaces of the channel structure CH. A sidewall of the lower channel structure LPC may be surrounded by a gate insulating layer GI. The gate insulating layer GI may extend along the sidewall of the lower channel structure LPC to open upper and bottom surfaces of the lower channel structure LPC.

The source layer SL may be in direct contact with the bottom surface of the lower channel structure LPC. The source layer SL may be formed of the same material as the source layer SL described with reference to FIG. 5A. The channel structure CH may be connected to the source layer SL via the lower channel structure LPC.

Referring to FIG. 5D, the channel structure CH may include pillar parts penetrating the electrode patterns CP1 to CPn and a horizontal part HP extending in a horizontal direction from the pillar parts. The horizontal part HP of the channel structure CH may extend in parallel to a lower surface of the first pattern CP1. The horizontal part HP may be disposed between a doped region DA and the first pattern CP1.

In an embodiment, the doped region DA may be formed of a doped semiconductor layer including a well dopant. The well dopant may include a p-type impurity. For example, the doped region DA may include p-type doped silicon.

A sidewall of each of the pillar parts may be surrounded by a memory layer ML. The memory layer ML may extend between the horizontal part HP corresponding thereto and the first pattern CP1. The memory layer ML may extend between the horizontal part HP corresponding thereto and the doped region DA.

Referring to FIG. 5E, the channel structure CH may include a source-side pillar S_PL, a drain-side pillar D_PL, and a horizontal part HP. The drain-side pillar D_PL penetrates the drain-side stack structure GST_D, and is connected to the horizontal part HP. The source-side pillar S_PL may be electrically connected to a common source line CSL disposed between the bit line BL and the source-side stack structure GST_S. The source-side pillar S_PL penetrates the source-side stack structure GST_S, and is connected to the horizontal part HP. The horizontal part HP may be buried in a pipe gate PG. The pipe gate PG may be disposed under the source-side stack structure GST_S and the drain-side stack structure GST_D, and surround the horizontal part HP. The pipe gate PG may be used as a gate of a pipe transistor. The pipe transistor may electrically connect the source-side pillar S_PL and the drain-side pillar D_PL through the horizontal part HP according to a signal transmitted to the pipe page PG.

An outer wall of the channel structure CH may be surrounded by a memory layer ML. The memory layer ML may extend along the outer wall of the channel structure CH to open an upper surface of the drain-side pillar D_PL and an upper surface of the source-side pillar S_PL.

Each of the memory layer ML, the first memory layer ML1, and the second memory layer ML2, which are described with reference to FIGS. 5A to 5E, may include a data storage layer for storing data. Each of the memory layer ML, the first memory layer ML1, and the second memory layer ML2 may include a tunnel insulating layer and a blocking insulating layer, which are disposed to face each other with the data storage layer interposed therebetween, in addition to the data storage layer. The data storage layer may be formed of a material layer capable of storing data changed using Fowler-Nordheim tunneling. To this end, the data storage layer may be formed of various materials. For example, the data storage layer may be formed of a nitride layer in which charges can be trapped. However, the embodiment of the present disclosure is not limited thereto, and the data storage layer may include silicon, a phase change material, nano dots, and the like. The blocking insulating layer may include an oxide layer capable of blocking charges. The tunnel insulating layer may be formed of a silicon oxide layer through which charges can tunnel.

Referring to FIGS. 5A to 5E, the gate stack structure GST and the channel structure CH penetrating the gate stack structure GST may be included in each of the memory blocks BLK described with reference to FIG. 2 or each of the memory blocks BLK1 to BLKk described with reference to FIGS. 3 and 4.

FIGS. 7A to 7E are plan views illustrating structures connecting transistors of the page buffer circuit PB shown in FIG. 2 to the bit lines BL1 to BLm in accordance with an embodiment of the present disclosure. A first direction I, a second direction II, and a third direction III, which are shown in FIGS. 7A to 7E, are the same as defined with reference to FIGS. 2 to 4.

Figure 7A:
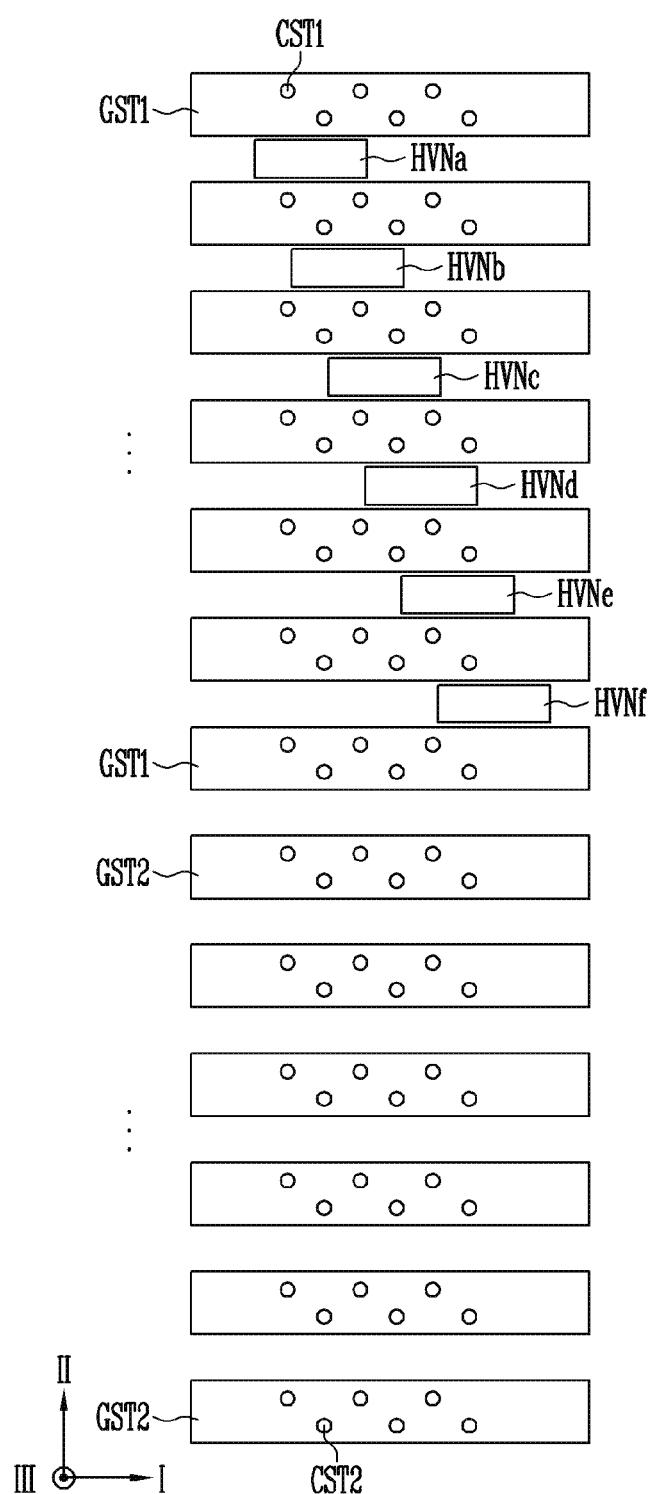

FIG. 7A is a plan view illustrating an embodiment of a layout of transistors HVNa to HVNf included in the page buffer circuit and gate stack structures GST1 and GST2. The transistor HVN described with reference to FIGS. 3 and 4 may correspond to any one of the transistors HVNa to HVNf shown in FIG. 7A.

Referring to FIG. 7A, the transistors HVNa to HVNf may be included in the page buffer circuit PB shown in FIG. 2. That is, the transistors HVNa to HVNf may be used to read data from cell strings CST1 and CST2 connected to the gate stack structures GST1 and GST2 or to program the cell strings CST1 and CST2.

The gate stack structures GST1 and GST2 may constitute the memory blocks BLK shown in FIG. 2 or the memory blocks BLK1 to BLKk shown in FIGS. 3 and 4. Each of the gate stack structures GST1 and GST2 may extend in the first direction I. The gate stack structures GST1 and GST2 may be arranged to be spaced apart from each other in the second direction II. The gate stack structures GST1 and GST2 may include first gate stack structures GST1 and second gate stack structures GST2. Each of the first gate stack structures GST1 may be connected to a plurality of first cell strings CST1, and each of the second gate stack structures GST2 may be connected to a plurality of second cell strings CST2. Each of the first cell strings CST1 and the second cell strings CST2 may include a gate stack structure corresponding thereto and a channel structure penetrating the gate stack structure as described with reference to FIGS. 5A to 5E.

The transistors HVNa to HVNf and the first gate stack structures GST1 may be alternately disposed in the second direction II. The second gate stack structures GST2 may be spaced apart from the first gate stack structures GST1, and be arranged in the second direction II. The transistors HVNa to HVNf may be arranged in a direction diagonal to the first and second directions I and II. The transistors HVNa to HVNf may be respectively exposed by spaces between adjacent first gate stack structures GST1 in the second direction II.

Figure 7B:
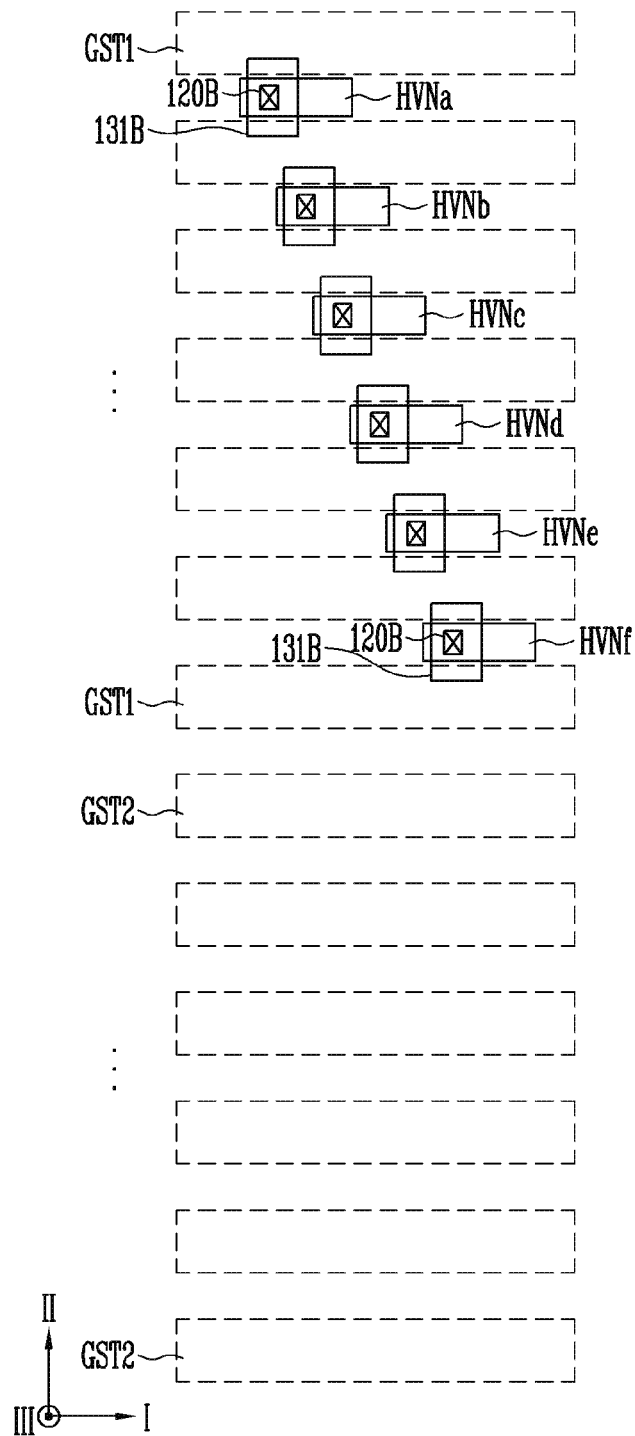
Figure 7C:
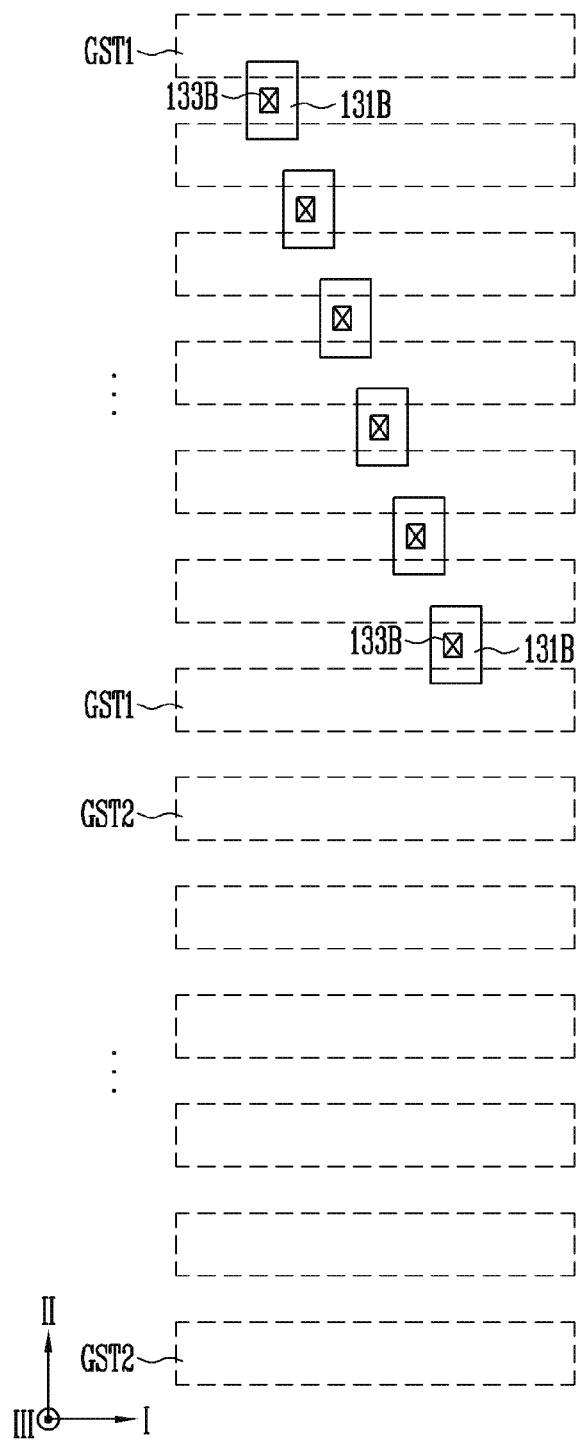

FIGS. 7B and 7C are plan views illustrating an embodiment of a layout of the transistors HVNa to HVNf and lower connection structures. Each of the lower connection structure 130 described with reference to FIG. 3 and the lower connection structure 130A described with reference to FIG. 4 corresponds to any one of the lower connection structures shown in FIGS. 7B and 7C.

Each of the lower connection structures may include a first connection pattern 120B and a second connection pattern 131B, which are shown in FIGS. 7B and 7C, and a third connection pattern 133B shown in FIG. 7C. Hereinafter, descriptions of the first connection pattern 120B, the second connection pattern 131B, and the third connection pattern 133B, which overlap with those described with reference to FIGS. 3 and 4, will be omitted.

Referring to FIG. 7B, a first connection pattern 120B corresponding to each of the transistors HVNa to HVNf may be connected. The first connection pattern 120B may be connected to a second connection pattern 131B corresponding thereto. The first connection pattern 120B and the second connection pattern 131B may be stacked in the third direction III. And the second connection pattern 131B may be disposed on the first connection pattern 120B.

Referring to FIG. 7C, the second connection pattern 131B may be connected to a third connection pattern 133B corresponding thereto. The second connection pattern 131B and the third connection pattern 133B may be stacked in the third direction III, and the third connection pattern 133B may be disposed on the second connection pattern 131B.

The lower connection structures including the first to third connection patterns 120B, 131B, and 133B shown in FIGS. 7B and 7C may be respectively disposed adjacent to the transistors HVNa to HVNf.

FIG. 7D is a plan view illustrating an embodiment of a layout of the above-described lower connection structures and conductive lines CLa to CLf.

Each of the conductive lines CLa to CLf may be connected to the third connection pattern 133B of a lower connection structure corresponding thereto. The conductive line CL1 described with reference to FIGS. 3 and 4 corresponds to any one of the conductive lines CLa to CLf. The conductive lines CLa to CLf may be arranged to be spaced apart from each other in the first direction I. Each of the conductive lines CLa to CLf may extend in the second direction II, and overlap with a third connection pattern 133B corresponding thereto. Each of the conductive lines CLa to CLf may be connected to a transistor corresponding thereto via a lower connection structure corresponding thereto.

Figure 7E:
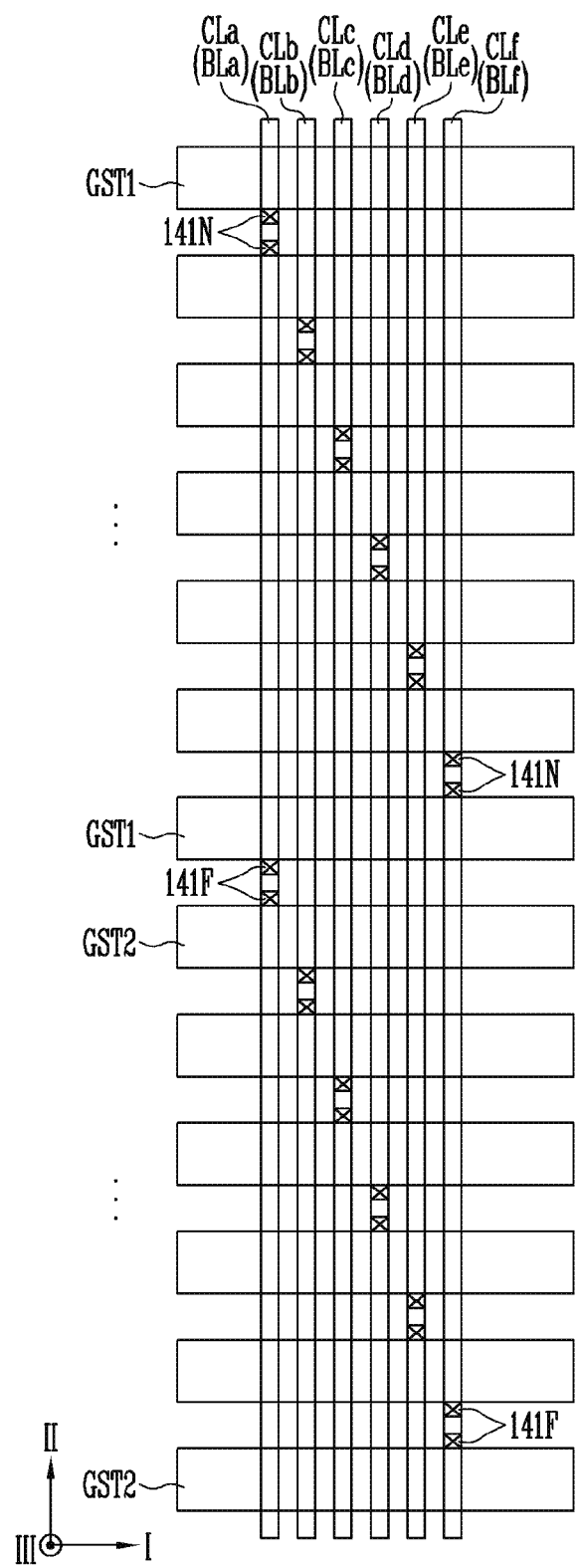

FIG. 7E is a plan view illustrating an embodiment of a layout of the conductive lines CLa to CLf and bit lines BLa to BLf.

The bit lines BLa to BLf may overlap with the conductive lines CLa to CLf. Although an example in which the bit lines BLa to BLf are disposed at the same pitch as the conductive lines CLa to CLf is illustrated in FIG. 7E, the embodiments of the present disclosure are not limited thereto. That is, a pitch between the bit lines BLa to BLf may be different from that between the conductive lines CLa to CLf.

The bit lines BLa to BLf may be disposed on the conductive lines CLa to CLf. The bit lines BL1 to BLm described with reference to FIG. 2 may include the bit lines BLa to BLf shown in FIG. 7E. The bit line BL1 described with reference to FIGS. 3 and 4 corresponds to any one of the bit lines BLa to BLf shown in FIG. 7E.

The gate stack structures GST1 and GST2 may be disposed between the conductive lines CLa to CLf and the bit lines BLa to BLf. The conductive lines CLa to CLf may extend in parallel to the bit lines BLa to BLf.

The conductive lines CLa to CLf may be connected to the bit lines BLa to BLf via first and second upper connection structures 141N and 141F corresponding thereto. The first upper connection structures 141N may be disposed between adjacent first gate stack structures GST1, and the second upper connection structures 141F may be disposed between adjacent second gate stack structures GST2 and between adjacent first and second gate stack structures GST1 and GST2.

At least one first upper connection structure 141N may be disposed between adjacent first gate stack structures GST1. For example, two first upper connection structures 141N may be disposed between adjacent first gate stack structures GST1.

At least on second upper connection structure 141F may be disposed between adjacent second gate stack structures GST2. For example, two second upper connection structures 141F may be disposed between adjacent second gate stack structures GST2.

At least one second upper connection structure 141F may be disposed between adjacent first and second gate stack structures GST1 and GST2. For example, two second upper connection structures 141F may be disposed between adjacent first and second gate stack structures GST1 and GST2.

The first and second upper connection structures 141N and 141F may extend in the third direction III toward the bit lines BLa to BLf from the conductive lines CLa to CLf. Each of the conductive lines CLa to CLf may be connected to a bit line corresponding thereto via at least one first upper connection structure 141N corresponding thereto and at least one second upper connection structure 141F corresponding thereto. For example, an a-conductive line CLa may be connected to an a-bit line BLa via a first upper connection structure 141N connected thereto and a second upper connection structure 141F connected thereto. The first upper connection structure 141N connected to the a-conductive line CLa may overlap with an a-transistor HVNa shown in FIG. 7A, or overlap with a lower connection structure connected to the a-transistor HVNa. The second upper connection structure 141F connected to the a-conductive line CLa may be further spaced apart from the a-transistor HVNa than the first upper connection structure 141N connected to the a-conductive line CLa. The second upper connection structure 141F connected to the a-conductive line CLa might not overlap with the lower connection structure connected to the a-transistor HVNa.

In accordance with the embodiment of the present disclosure described above, a plurality of contact nodes for transmitting signals from the transistors HVNa to HVNf to the bit lines BLa to BLf through the conductive lines CLa to CLf can be provided. Accordingly, in the embodiment of the present disclosure, a loading difference between the bit lines BLa to BLf can be reduced. Further, in an embodiment of the present disclosure, a loading effect of each of the bit lines BLa to BLf can be reduced through the conductive lines CLa to CLf having a resistance lower than that of the bit lines BLa to BLf. Accordingly, in an embodiment of the present disclosure, a precharge time of the bit lines BLa to BLf can be reduced during an operation of the memory cell array, and thus the operation speed of the memory cell array can be improved. Further, in an embodiment of the present disclosure, the degradation of threshold voltage distributions of memory cells can be minimized.

Figure 8:
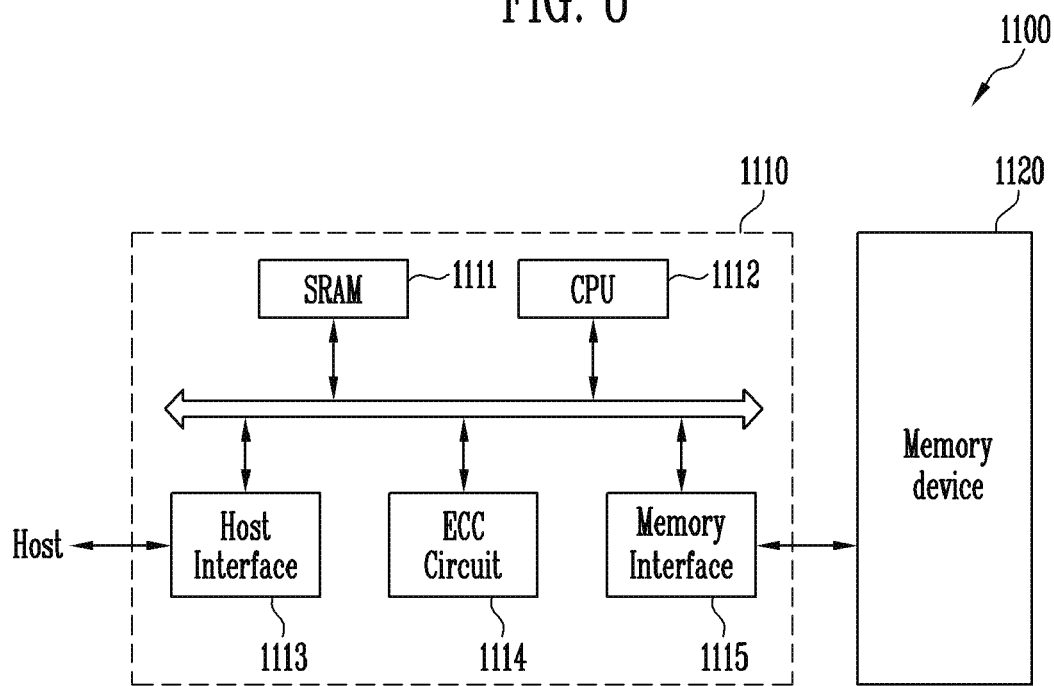
FIG. 8 is a block diagram illustrating a configuration of a memory system in accordance with an embodiment of the present disclosure.

FIG. 8 is a block diagram illustrating a configuration of a memory system in accordance with an embodiment of the present disclosure.

Referring to FIG. 8, the memory system 1100 in accordance with the embodiments of the present disclosure includes a memory device 1120 and a memory controller 1110.

The memory device 1120 may be a multi-chip package configured with a plurality of flash memory chips. The memory device 1120 may include a lower connection structure connected to a transistor, a bit line connected to a memory cell array, a conductive line disposed between the lower connection structure and the bit line, the conductive line being connected to the lower connection structure, and two or more upper connection structures connecting the conductive line to the bit line.

The memory controller 1110 is configured to control the memory device 1120, and may include a static random access memory (SRAM) 1111, a CPU 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 9:
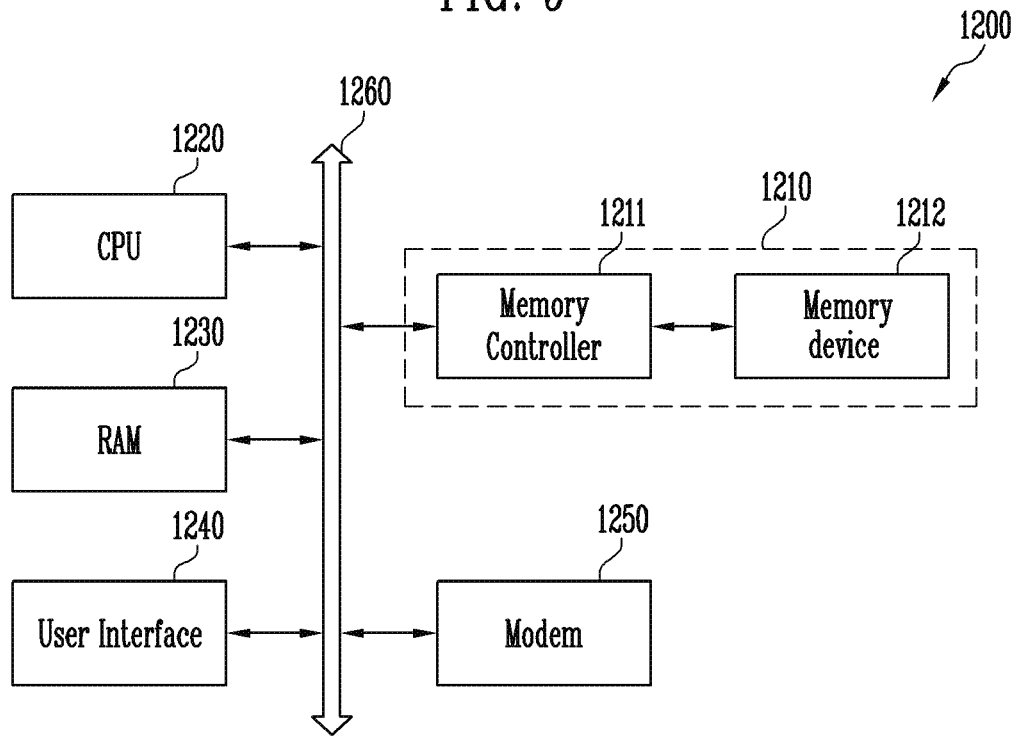
FIG. 9 is a block diagram illustrating a configuration of a computing system in accordance with an embodiment of the present disclosure.

FIG. 9 is a block diagram illustrating a configuration of a computing system in accordance with an embodiment of the present disclosure.

Referring to FIG. 9, the computing system 1200 in accordance with the embodiments of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included. The memory system 1210 in accordance with the embodiments of the present disclosure includes a memory device 1212 and a memory controller 1211. The memory device 1212 may be a multi-chip package configured with a plurality of flash memory chips. The memory device 1212 may include a lower connection structure connected to a transistor, a bit line connected to a memory cell array, a conductive line disposed between the lower connection structure and the bit line, the conductive line being connected to the lower connection structure, and two or more upper connection structures connecting the conductive line to the bit line. The memory controller 1211 may be configured to control the memory device 1120, and may include a static random access memory (SRAM) 1111, a CPU 1112, a host interface 1113, an error correction code (ECC) circuit 1114, and a memory interface 1115 as shown in FIG. 8.

In accordance with the present disclosure, a conductive line is disposed between a transistor and a bit line corresponding thereto. In accordance with the present disclosure, a plurality of nodes for connecting a bit line to a transistor corresponding thereto through a conductive line are provided. Accordingly, a loading effect of the bit line is reduced, and thus the operational reliability of the semiconductor memory device can be improved.

What is claimed is:

1. A semiconductor memory device comprising:
    a memory cell array disposed on a substrate;
        a bit line connected to the memory cell array;
        a peripheral circuit disposed between the memory cell array and the substrate, the peripheral circuit including a transistor;
        a conductive line disposed between the memory cell array and the transistor;
        a lower connection structure connecting the conductive line and the transistor; and
        two or more upper connection structures directly connecting the bit line and the conductive line, the two or more upper connection structures being spaced apart from each other.

2. The semiconductor memory device of claim 1, wherein a cell string included in the memory cell array is disposed between the upper connection structures.

3. The semiconductor memory device of claim 1, wherein the conductive line extends in parallel to the bit line.

4. The semiconductor memory device of claim 1, wherein the conductive line has a resistance lower than that of the bit line.

5. The semiconductor memory device of claim 1, wherein the transistor is included in a page buffer circuit for reading data from the memory cell array or programming the memory cell array.

6. The semiconductor memory device of claim 1, wherein the lower connection structure includes:
   a first conductive contact plug connected to the transistor, the first conductive contact plug extending toward the conductive line;
   a first metal pattern disposed on the first conductive contact plug;
   a second conductive contact plug extending toward the conductive line from the first metal pattern;
   a second metal pattern disposed on the second conductive contact plug; and
   a third conductive contact plug connected between the second metal pattern and the conductive line.

7. The semiconductor memory device of claim 6,
   wherein the first metal pattern includes an area wider than the first conductive contact plug; and
   wherein the second metal pattern includes an area wider than the second conductive contact plug.

8. The semiconductor memory device of claim 1, wherein the memory cell array includes memory blocks disposed between the bit line and the conductive line,
   wherein each of the memory blocks includes:
   a gate stack structure including gate electrodes stacked to be spaced apart from each other; and
   a channel structure penetrating the gate stack structure.

9. The semiconductor memory device of claim 8, wherein at least one of the memory blocks is disposed between the upper connection structures adjacent to each other.

10. The semiconductor memory device of claim 1, wherein the upper connection structures include:
    a first upper connection structure overlapping with the lower connection structure; and
    a second upper connection structure spaced apart from the first upper connection structure.

11. A semiconductor memory device comprising:
    a bit line disposed on a substrate including a transistor;
    a conductive line disposed between the substrate and the bit line, wherein the conductive line extends in parallel to the bit line;
    a lower connection structure connected between the transistor and the conductive line;
    first and second upper connection structures extending toward the bit line from the conductive line to be in contact with the conductive line and the bit line; and
    a first cell string disposed between the first upper connection structure and the second upper connection structure, the first cell string being connected to the bit line.

12. The semiconductor memory device of claim 11, further comprising a second cell string disposed between the first upper connection structure and the second upper connection structure, the second cell string being connected to the bit line.

13. The semiconductor memory device of claim 12, wherein a distance between the transistor and the second cell string is greater than that between the transistor and the first cell string.

14. The semiconductor memory device of claim 11, wherein the conductive line has a resistance lower than that of the bit line.

15. The semiconductor memory device of claim 11, wherein the transistor is included in a page buffer circuit for reading data from the first cell string or programming the first cell string.

16. The semiconductor memory device of claim 11, wherein the first cell string includes a gate stack structure disposed between the bit line and the conductive line and a channel structure penetrating the gate stack structure.

* * * * *